US007939993B2

(12) United States Patent
Lisec et al.

(10) Patent No.: US 7,939,993 B2
(45) Date of Patent: May 10, 2011

(54) MICROMECHANICAL HF SWITCHING ELEMENT AND METHOD FOR THE PRODUCTION THEREOF

(75) Inventors: Thomas Lisec, Itzehoe (DE); Christoph Huth, Itzehoe (DE)

(73) Assignee: Fraunhofer-Gesellschaft zur Förderung der angewandten Forschung e. V., Munich (DE)

( * ) Notice: Subject to any disclaimer, the term of this patent is extended or adjusted under 35 U.S.C. 154(b) by 760 days.

(21) Appl. No.: 11/628,246

(22) PCT Filed: May 27, 2005

(86) PCT No.: PCT/DE2005/000966
§ 371 (c)(1), (2), (4) Date: Sep. 7, 2007

(87) PCT Pub. No.: WO2005/119831
PCT Pub. Date: Dec. 15, 2005

(65) Prior Publication Data

US 2008/0047809 A1 Feb. 28, 2008

(30) Foreign Application Priority Data

Jun. 1, 2004 (DE) ......................... 10 2004 026 654

(51) Int. Cl.
*H01L 41/08* (2006.01)

(52) U.S. Cl. .......... 310/330; 310/331; 200/181; 29/622; 29/25.35

(58) Field of Classification Search .......... 310/330–332; 200/181; 29/622, 25.35
See application file for complete search history.

(56) References Cited

U.S. PATENT DOCUMENTS

| | | | | |
|---|---|---|---|---|
| 3,922,475 | A * | 11/1975 | Manasevit | 428/700 |
| 6,239,402 | B1 * | 5/2001 | Araki et al. | 219/121.4 |
| 6,329,305 | B1 * | 12/2001 | Bower et al. | 438/800 |
| 6,376,787 | B1 * | 4/2002 | Martin et al. | 200/181 |
| 6,876,482 | B2 * | 4/2005 | DeReus | 359/290 |
| 6,944,922 | B2 * | 9/2005 | Shearer et al. | 29/25.35 |

(Continued)

FOREIGN PATENT DOCUMENTS

DE 103 10 342 A1 11/2003

(Continued)

OTHER PUBLICATIONS

German Office Action, dated Feb. 1, 2005, issued in counterpart application No. 10 2004 026 654.9-S4, and English Translation.

(Continued)

*Primary Examiner* — J. SanMartin
(74) *Attorney, Agent, or Firm* — Venable LLP; Robert Kinberg; Christopher Ma

(57) ABSTRACT

The present invention relates to a micromechanical HF switching element, in which a freestanding movable element is situated above a metallic surface on a substrate in such way that it is drawn to the metallic surface, to which a dielectric layer is applied, by applying an electrical voltage between the metallic surface and the movable element. The present invention also relates to a method for producing micromechanical HF switching elements of this type, in which the dielectric layer is deposited on the metal surface. The present method is distinguished in that a piezoelectric AlN layer having a columnar, polycrystalline structure and a texture is deposited on the metallic surface as the dielectric layer. Significantly reduced charging of the dielectric material and increased long-term stability of the switching element are achieved by the present method and the HF switching element thus produced.

10 Claims, 1 Drawing Sheet

U.S. PATENT DOCUMENTS

| | | | | |
|---|---|---|---|---|
| 7,471,031 | B2 * | 12/2008 | Kawakubo et al. | 310/330 |
| 7,545,246 | B2 * | 6/2009 | Kim et al. | 335/78 |
| 7,567,018 | B2 * | 7/2009 | Kawakubo et al. | 310/328 |
| 2003/0179535 | A1 * | 9/2003 | Shimanouchi et al. | 361/278 |
| 2004/0012298 | A1 * | 1/2004 | Cunningham et al. | 310/306 |
| 2004/0148771 | A1 * | 8/2004 | Ma et al. | 29/849 |
| 2006/0208823 | A1 * | 9/2006 | Hunt et al. | 333/24 C |
| 2007/0024403 | A1 * | 2/2007 | Kwon et al. | 335/78 |
| 2008/0017489 | A1 * | 1/2008 | Kawakubo et al. | 200/181 |
| 2008/0164237 | A1 * | 7/2008 | Kawakubo et al. | 216/17 |
| 2008/0283373 | A1 * | 11/2008 | Caruyer et al. | 200/181 |
| 2009/0206702 | A1 * | 8/2009 | Kawakubo et al. | 310/330 |

FOREIGN PATENT DOCUMENTS

| | | | | |
|---|---|---|---|---|
| EP | 1 124 269 | A | | 8/2001 |
| JP | 04250611 | A | * | 9/1992 |
| JP | 2006140271 | A | * | 6/2006 |

OTHER PUBLICATIONS

Dubois, et al., "Properties of aluminum nitride thin films for piezoelectric transducers and microwave filter applications," *Applied Physics Letters*, vol. 74, No. 20, pp. 3032-3034 (1999).

Yao et al., "Micromachines Low-Loss Microwave Switches," *IEEE Journal of Microelectromechanical Systems*, vol. 8, No. 2, pp. 129-134 (1999).

Kaiser, "The potential of MEMS components for re-configurable RF interfaces in mobile communication terminals," European Solid-State Circuits Conference, Villach, Austria, Sep. 18-20, 2001.

Jakkaraju, et al., "Electrode and AIN Depostions for Bulk Acoustic Wave (BAW) Devices," Proc. MEMSWAVE 2003, Toulouse, France, pp. E-13 et seq.

D. Mangalaraj, et al. "Current-voltage characteristics of aluminium nitride films formed by RF glow discharge;" J. Phys. D: Appl. Phys., 13 (1980), pp. L101-L 105.

R. Jakkaraju, et al., "Integrated approach to electrode and AIN depositions for bulk acoustic wave (BAW) devices.", Microelectronic Engineering 70 (2003), pp. 566-570.

Dubois et al., "Aluminum Nitride Thin Films For High Frequency Applications," Ferroelectrics, Overseas Publishers Associaion, vol. 224, No. 1-4, pp. 243-250 (1999).

Wong et al., "Micromachined Capacitive Switches at Microwave Frequencies," Proceedings of the SPIE, vol. 4175, pp. 140-148 (2000).

Naik, et al., "Low-temperature deposition of highly textured aluminum nitride by direct current magnetron sputtering for applications in thin-film resonators," Journal of the Electrochemical Society, pp. 691-696 (1999).

Dubois, et al., "Properties of aluminum nitride thin films for piezoelectric transducers and microwave filter applications," Applied Physics Letters, vol. 74, No. 20, pp. 3032-3034 (1999).

Yao et al., "Micromachined Low-Loss Microwave Switches," IEEE Journal of Microelectromechanical Systems, vol. 8, No. 2, pp. 129-134 (1999).

Kaiser, "The potential of MEMS components for re-configurable RF interfaces in mobile communication terminals," European Solid-State Circuits Conference, Villach, Osterreich, 18.-20. (2001).

International Search Report dated Sep. 19, 2005, issued in PCT/DE2005/000966.

* cited by examiner

MICROMECHANICAL HF SWITCHING ELEMENT AND METHOD FOR THE PRODUCTION THEREOF

AREA OF TECHNICAL APPLICATION

The present invention relates to a micromechanical HF switching element, in which a freestanding movable element is situated above a metal surface on a substrate in such a way that it is drawn to the metal surface, to which a dielectric layer is applied, by application of an electrical voltage between the metal surface and the movable element. The present invention also relates to a method for producing micromechanical HF switching elements of this type, in which the dielectric layer is deposited on the metal surface.

High-frequency technology based on surface micromechanical components is becoming increasingly widespread. It is undisputed that MEMS switches (MEMS: micro electromechanical systems) have an array of decisive advantages in relation to typical systems which use PIN diodes or FET switches on silicon or gallium arsenide substrates. In particular at higher frequencies of greater than 20 GHz, the damping is much less and/or the insulation is much greater in MEMS components than, for example, in gallium arsenide components. Furthermore, MEMS switches typically display a very low power consumption and nearly ideal linear behavior.

In addition to the lack of cost-effective packaging concepts on the wafer level, the lack of long-term stability of many HF MEMS switches represents a central problem. MEMS switches are very complex components. Analogously to acceleration or speed sensors, they are based on freestanding movable structures whose mechanical and electrical properties must be sufficiently good and whose dimensional accuracy must be sufficiently high.

Furthermore, because of their function, surfaces repeatedly come into contact with one another in MEMS switches, so that adhesion and friction, as well as effects induced by strong electrical fields play a significant role. Since the signal frequencies are in the GHz range, the electrical resistance of polysilicon, the preferred material for acceleration or speed sensors, is much too high for HF MEMS switches. Therefore, metals are used for the freestanding structures of HF MEMS switches, predominantly gold, aluminum, or aluminum alloys. This restricts the possibilities of the production of switches of this type very strongly, since the processing temperatures must remain restricted to below 400° C. because of the low thermal stability of these materials.

In the simplest case, an HF MEMS switch comprises a freestanding metal diaphragm, which is held on a substrate by arbitrarily shaped metal suspensions over a metal signal line. A thin dielectric layer is located on the signal line below the diaphragm. The distance between the diaphragm and the signal line is very small and may be 2-3 μm in the rest state, for example. In this state, the capacitance is very low and HF signals running via the signal line may pass the switch nearly uninfluenced. By applying an electrical voltage between diaphragm and signal line, the diaphragm may be drawn to the signal line. If the capacitance change thus induced is large enough, the signal line is blocked and the HF signals are nearly completely reflected. The most important parameter of the switch is the ratio of the capacitances in the on and off states, respectively, the on-off ratio. For the mobile radio range (0.8-2.4 GHz), it must be at least 100 to keep the signal losses in the on state low. At transmission frequencies from approximately 10 GHz, an on-off ratio of 30-40 is typically sufficient. The on-off ratio is determined above all by the thickness and the dielectric constant $\in_r$ of the dielectric layer, as well as the roughness of the surfaces coming into contact, i.e., the top of the dielectric layer and the bottom of the diaphragm. The thinner the dielectric material and therefore the higher its $\in_r$, the greater the on-off ratio.

Since the signal line comprises a metal, not every dielectric layer available in IC technology may be applied thereto. As already noted, the deposition temperature of the dielectric material is limited to at most 400° C. In many cases, the part of the signal line located directly below the diaphragm is manufactured from a metal which does not conduct especially well but has a high melting point, such as tungsten, titanium, tantalum, or platinum, and is subsequently extended on both sides of the switch area using a highly conductive metal. In the temperature range up to 400° C., standard low temperature LPCVD processes for doped and undoped $SiO_2$ layers such as LTO or PSG and PECVD processes for $SiO_2$, $Si_3N_4$, or doped oxides such as PSG and BPSG are available in IC technology. Sputtering is also suitable for depositing dielectric layers, but has not been established for the cited materials. Furthermore, greatly varying layers may also be produced by sol-gel methods, laser-induced deposition, and other processes.

PRIOR ART

The dielectric material currently used most frequently for capacitive HF MEMS switches is PECVD $Si_3N_4$. It is commonly available in every IC factory, may be produced in high quality in layer thicknesses from 100 nm, has an $\in_r$ of 6-7 and is distinguished by a relatively high chemical resistance. An example of a capacitive HF MEMS switch and the method for its production may be inferred from the publication of Z. J. Yao et al., "Micromachined low-loss microwave switches", IEEE Journal of Microelectromech. Sys., Vol. 8, No. 2, 1999, pages 129-134.

However, if this dielectric material is selected, so-called charging occurs, i.e., the injection of charge carriers under the influence of high electric fields and/or their permanent trapping in the volume of the dielectric layer. The charges cause a drift of the voltage required for switching and, in addition, result in sticking of the diaphragm to the dielectric material after a certain time, i.e., the breakdown of the switch. The recombination of the charges may take days. Reversing the polarity of the switching voltage during each switching procedure reduces the charging significantly, but does not suppress it completely, since injection and recombination mechanisms are not equal. Sooner or later breakdown of the switch therefore nonetheless occurs.

In addition to PECVD $Si_3N_4$, until now PECVD $SiO_2$ and $Ta_2O_5$ have also been used as dielectric layers in HF MEMS switches, the latter having been applied electrochemically. Furthermore, the applicants are aware of HF MEMS switches having PECVD $Al_2O_3$ and BST, which was applied using laser deposition, as dielectric layers. However, up to this point there have either been no investigations of the charging and the long-term stability of these dielectric layers or the dielectric layers must be applied having a very low layer thickness to achieve the required on-off ratio as in the case of PECVD $SiO_2$. Significant charging has been established in electrochemically produced $Ta_2O_5$.

The object of the present invention is to specify a method for producing micromechanical HF switching elements and a micromechanical HF switching element producible using the method, in which the dielectric layer has high long-term stability and low charging.

DESCRIPTION OF THE INVENTION

The object is achieved by the method and the micromechanical HF switching element according to claims 1 and 6.

Advantageous embodiments of the method and the switching element are the subject matter of the subclaims or may be inferred from the following description and the exemplary embodiments.

The method according to the present invention is based on the use of a specially deposited, piezoelectric AlN layer as a dielectric material on the metal surface, such as a signal line, of the substrate. The AlN is deposited in such a way that a layer having a columnar, polycrystalline structure and a texture forms on the metal surface. The dielectric layer is preferably sputtered on for this purpose. The layer thickness of this specially deposited dielectric AlN layer is preferably in the range between 100 and 500 nm.

Significantly reduced charging and a significantly higher long-term stability in relation to PECVD $Si_3N_4$ may be achieved using a dielectric layer built up and/or deposited in this way. It was recognized for this purpose that the presence of a certain crystal order in the dielectric material plays an essential role in the reduction of the charging effect. Typical features of a crystal order of this type for thin layers are a columnar, polycrystalline structure and the presence of a texture, i.e., a preferred orientation of the crystals. However, this layer structure is typically only achieved using materials which are deposited at higher temperatures, which are incompatible with micromechanical HF switches, such as polysilicon. However, the inventor of the present method and of the associated HF MEMS switching element have found a material in AlN that may be deposited on a metal structure having a layer structure of this type even at lower processing temperatures. Thus, processes for producing high-quality piezoelectric AlN layers have already been described in another technical area for producing BAW resonators (BAW: bulk acoustic wave) (see, for example, R. Jakkaru et al., "Electrode and AlN depositions of bulk acoustic wave (BAW) devices" Proc. MEMSWAVE 2003, Toulouse, France, pages E-13 et seq.), which may also be used for the present application. The thin AlN layers obtained in this case additionally have high homogeneity of the properties, the layer thickness, and the intrinsic tensions.

Especially good results were achieved with deposition on metal surfaces made of platinum in the production of micromechanical HF switching elements using the piezoelectric AlN layers produced in this way. With this preferred combination, an especially smooth surface of the dielectric layer results, which also contributes to increasing the long-term stability of the switching element.

The present micromechanical HF switching element has a freestanding movable element in a known way, such as a diaphragm or a flexing boom configuration, which is attached to suitable suspensions over a metal surface on the substrate. The dimensions and the material of the suspensions and of the movable element are selected in such way that this element is drawn by electrostatic attraction to the metal surface by applying an electrical voltage between the metal surface and the movable element. In the present HF switching element, a piezoelectric AlN layer having a columnar, polycrystalline structure and a texture is applied as a dielectric layer to the metal surface. The metal surface itself is a component of an HF signal line or may also merely be connected to a control line for controlled movement of the freestanding element, depending on the function of the switching element. In principle, the present switching element may be implemented as a capacitive HF switch or also as another electrostatically actuated HF switch, as are known from the prior art.

BRIEF DESCRIPTION OF THE DRAWING

The present HF switching element will be explained once again briefly in the following on the basis of an exemplary embodiment in connection with the drawing.

WAYS OF IMPLEMENTING THE INVENTION

Figure 1:
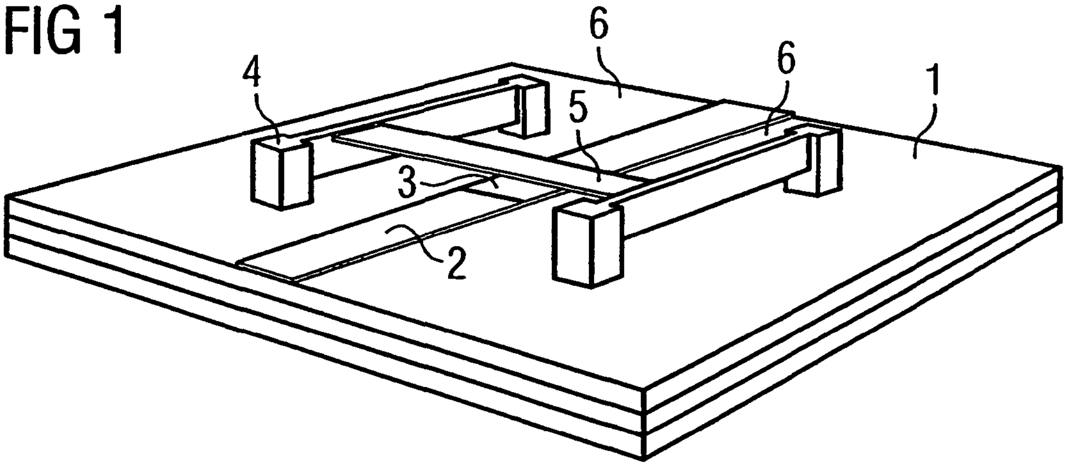
FIG. 1 shows a schematic illustration of a capacitive HF switching element in a perspective view and FIG. 2 shows a schematic illustration of a capacitive HF switching element in a top view.

The substrate 1, to which a signal line 2 for transmitting the HF signals is applied as a metal layer, is shown in the schematic illustration of a capacitive HF MEMS switch of FIG. 1. Suspensions 4 are constructed on the substrate 1 on both sides of the signal line 2, which hold a metal diaphragm 5 as a freestanding movable element of the switch at a distance above the substrate surface. The metal suspensions 4 are dimensioned in such way that the diaphragm 5 floats only a few μm above the signal line 2. A dielectric material 3, which was produced according to the present method, is applied to the signal line 2 below the diaphragm 5. This dielectric material is therefore a preferably sputtered, piezoelectric AlN layer, which has a columnar, polycrystalline structure having a texture.

By applying an electrical voltage between the signal line 2 and the diaphragm 5, the diaphragm 5 is drawn down to the dielectric material 3, by which HF signals transmitted on the signal line 2 are reflected and thus blocked at this point. When the voltage is turned off, the diaphragm 5 detaches again from the dielectric material because of the intrinsic mechanical tension, so that the HF signals may pass again. To support the switching procedure, additional switch electrodes 6 may be implemented on the substrate 1 below the diaphragm 5, which are also provided with a dielectric layer.

Figure 2:
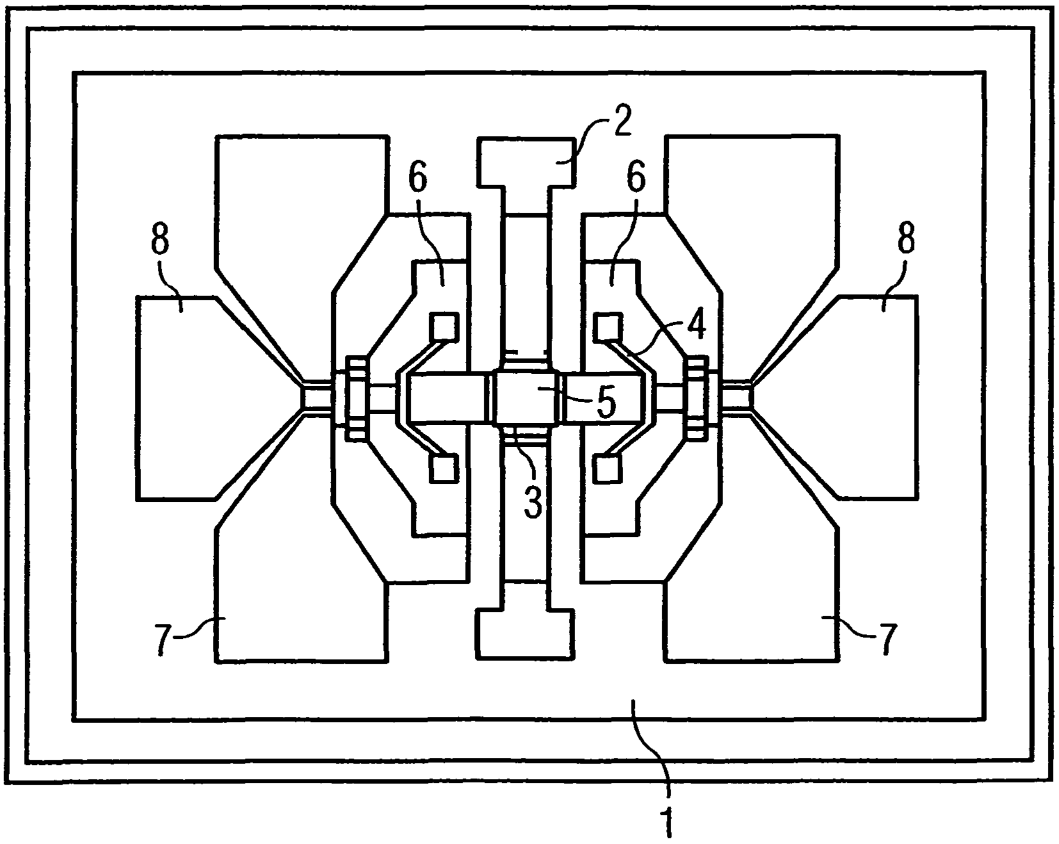

FIG. 2 shows an example of the implementation of an HF MEMS switch according to the present invention in a top view. The diaphragm 5 is made of nickel in this example and has a thickness of approximately 1 μm. The spring-like suspensions 4 also comprise nickel. They have a thickness of approximately 15 μm and hold the diaphragm 5 at a distance of approximately 3 μm above the substrate surface. The metal supply lines are implemented from gold as CPW (coplanar waveguides), i.e., they are composed of the central signal line and the ground lines 7 on the right and left of the signal line 2. The suspensions 4 are also anchored on these ground lines 7. In the area below the diaphragm 5, the piezoelectric AlN layer is applied to the signal line 2 as a dielectric material 3 having a columnar, polycrystalline structure and a texture, in the present example having a layer thickness of 200 nm.

Two switching electrodes 6 are located below the diaphragm 5, which are used for switching down the diaphragm 5 and may be contacted via terminal pads 8. The switching electrodes 6 are also provided with a dielectric material, which is composed of the dielectric AlN layer and an additional 250 nm thick PECVD nitride. By using the switching electrodes 6, high switching voltages do not have to be applied between the signal line 2 and the diaphragm 5, but rather only comparatively low retention voltages.

The switching procedure is performed in the following way. Firstly, the retention voltage is applied to the signal line 2. This retention voltage may be a DC voltage, an AC voltage, or a combination of both voltages. The diaphragm 5 of the switch still remains in the upper position (up position). The diaphragm 5 is drawn downward (down position) by a brief DC voltage pulse at the switching electrodes 6. It remains in this down position until the retention voltage is turned off. It then returns to the up position.

During a comparison of an HF switch of this type with the present suggested AlN switch using an identically constructed HF switch having a 110 nm thick PECVD $Si_3N_4$ layer as a dielectric material, significantly improved switching behavior and significantly lower charging of the present switch were able to be detected. In particular, in contrast to the PE nitride, with the present selected dielectric material, the polarity of the DC voltage component of the retention voltage did not have to be changed upon each switching procedure. A capacitance drop does not occur as the diaphragm is retained. The diaphragm remains down as long as the retention voltage is applied. After turning off the retention voltage, the diaphragm immediately jumps back up, even after a retention time of more than 1 hour. In contrast to this, the diaphragm already detaches again independently after a few seconds if a dielectric material made of PE nitride is used. This behavior is attributed to the significant charging of the PE nitride.

LIST OF REFERENCE NUMERALS

1 substrate
2 signal line
3 dielectric material
4 suspension
5 diaphragm
6 switching electrodes
7 crown lines
8 terminal for switching electrodes

The invention claimed is:

1. A micromechanical high frequency (HF) switching element comprising:

a substrate;

a metallic surface, on the substrate, to which a dielectric layer including piezoelectric AlN layer having a columnar, polycrystalline structure and a texture is applied;

a freestanding movable element situated above the metallic surface on the substrate in such way that the movable element may be drawn to the metallic surface by applying an electrical voltage between the metallic surface and the movable element.

2. The micromechanical HF switching element according to claim 1, wherein the dielectric layer has a layer thickness between 100 and 500 nm.

3. The micromechanical HF switching element according to claim 1, wherein the metallic surface comprises platinum.

4. The micromechanical HF switching element according to claim 1, wherein the metallic surface is a section of an HF signal line.

5. The micromechanical HF switching element according to claim 1, wherein the movable element comprises a metallic or metallically coated diaphragm attached to spring-like suspensions above the metallic surface.

6. A method for producing micromechanical high frequency (HF) switching elements, using a capacitive and/or electrostatic action principle between a freestanding movable element and a metallic surface on a substrate, comprising:

depositing a dielectric layer including a piezoelectric AlN layer having a columnar, polycrystalline structure and a texture on the metallic surface.

7. The method according to claim 6, wherein the dielectric layer is deposited at a layer thickness between 100 and 500 nm.

8. The method according to claim 6, wherein the dielectric layer is sputtered on.

9. The method according to claim 6, wherein the metallic surface comprises platinum.

10. The method according to claim 6 for producing capacitive HF switches.

* * * * *